(12) United States Patent
Ohira

(10) Patent No.: US 8,559,182 B2
(45) Date of Patent: Oct. 15, 2013

(54) DEVICE MODULE AND ELECTRONIC DEVICE

(75) Inventor: Hiroki Ohira, Kiyose (JP)

(73) Assignee: Casio Computer Co., Ltd, Tokyo (JP)

( * ) Notice: Subject to any disclaimer, the term of this patent is extended or adjusted under 35 U.S.C. 154(b) by 129 days.

(21) Appl. No.: 13/205,740

(22) Filed: Aug. 9, 2011

(65) Prior Publication Data

US 2012/0044658 A1 Feb. 23, 2012

(30) Foreign Application Priority Data

Aug. 17, 2010 (JP) ................................. 2010-182151

(51) Int. Cl.
*H05K 5/00* (2006.01)
(52) U.S. Cl.
USPC ............................ 361/752; 361/748; 361/736
(58) Field of Classification Search
USPC ............................. 361/752, 748, 736; 174/50
See application file for complete search history.

(56) References Cited

U.S. PATENT DOCUMENTS

| | | | | |
|---|---|---|---|---|
| 4,209,735 A | * | 6/1980 | Yoshida | 320/101 |
| 4,558,427 A | * | 12/1985 | Takeuchi et al. | 361/679.09 |
| 4,627,736 A | * | 12/1986 | Komaki | 368/88 |
| 4,836,786 A | * | 6/1989 | Wong | 434/365 |
| 4,847,798 A | * | 7/1989 | Kurashima | 361/679.09 |
| 5,175,873 A | * | 12/1992 | Goldenberg et al. | 455/351 |
| 2003/0142588 A1 | * | 7/2003 | Kawatahara | 368/10 |

FOREIGN PATENT DOCUMENTS

| | | |
|---|---|---|
| JP | 61-177562 | 8/1986 |
| JP | 63-076952 | 5/1988 |
| JP | 2001-235560 | 8/2001 |
| JP | 2005-159566 | 6/2005 |
| JP | 2006-128838 | 5/2006 |
| JP | 2008-010281 | 1/2008 |
| JP | 2008-058567 | 3/2008 |

OTHER PUBLICATIONS

Japanese Office Action for Japanese Application No. 2010-182151 issued on Jun. 19, 2012.
Japanese Office Action for Japanese Application No. 2010-182151 issued on Feb. 12, 2013, 8 pages.

* cited by examiner

*Primary Examiner* — Timothy J Thompson
*Assistant Examiner* — Andargie M Aychillhum
(74) *Attorney, Agent, or Firm* — Turocy & Watson, LLP

(57) ABSTRACT

There is provided a device module. The device module includes: a key input portion; a display portion; a power supply portion; a circuit board, wherein the key input portion, the display portion and the power supply portion are mounted on and electrically connected to the circuit board; and a sheet member, wherein the key input portion, the display portion, the power supply portion and the circuit board are enveloped in and sealed with the sheet member.

7 Claims, 12 Drawing Sheets

DEVICE MODULE AND ELECTRONIC DEVICE

CROSS-REFERENCE TO RELATED APPLICATION

This application claims priority from Japanese Patent Application No. 2010-182151, filed on Aug. 17, 2010, the entire contents of which are hereby incorporated by reference.

BACKGROUND

1. Technical Field

Embodiments described herein relate to a device module used in an electronic device such as a small-sized electronic calculator, a cellular phone, an electronic dictionary or a watch, and an electronic device including the device module.

2. Related Art

JP-A-2001-235560 describes some electronic devices such as wristwatches, each of which is formed so that a device module protected by a protection cover is incorporated in a watch casing.

In this case, the device module has a watch movement, a dial plate, watch hands and a crown which are covered with a transparent protection cover. In this state, the watch movement, the dial plate, the watch hands and the crown are separably incorporated in the watch casing. The protection cover is formed to protect the watch hands and the dial plate from being injured when the device module is taken out from the watch casing.

In such an electronic device according to the background art, the device module is formed to be protected by the protection cover to thereby prevent the watch hands and the dial plate from being damaged. However, the structure is provided in such a manner that the protection cover cannot give water proofing property and dust proofing property to the device module. There is hence a problem that the device module needs to be taken out from the watch casing when the watch casing is washed with water, that is, the water casing must be washed with water in the state where the device module is taken out from the watch casing.

SUMMARY OF THE INVENTION

Exemplary embodiments described herein provide a device module and an electronic device which can be kept waterproof and dustproof in a simple structure and can be washed with water.

According to one or more illustrative aspects of the present invention, there is provided a device module. The device module includes: a key input portion; a display portion; a power supply portion; a circuit board, wherein the key input portion, the display portion and the power supply portion are mounted on and electrically connected to the circuit board; and a sheet member, wherein the key input portion, the display portion, the power supply portion and the circuit board are enveloped in and sealed with the sheet member.

According to one or more illustrative aspects of the present invention, there is provided an electronic device. The electronic device includes: the device module mentioned above; and a device casing, wherein the device module is incorporated in the device module.

Other aspects and advantages of the present invention will be apparent from the following description, the drawings and the claims.

DETAILED DESCRIPTION OF EXEMPLARY EMBODIMENTS

According to exemplary embodiments of the invention, the device module can be kept waterproof and dustproof in a simple structure in which the key input portion, the display portion, the power supply portion and the circuit board are entirely enveloped in a sheet member so as to be sealed with the sheet member in the condition that the key input portion, the display portion and the power supply portion are electrically connected to the circuit board. For this reason, the device module can be washed with water directly and the structure of the device casing can be simplified because it is unnecessary to provide any water proofing structure in the device casing in which the device module is put. Moreover, the device casing can be washed with water directly in the condition that the device module is incorporated in the device casing. Thus, it is possible to provide a device module with good user-friendliness.

Hereinafter, exemplary embodiments of the present invention will be now described with reference to the drawings. It should be noted that the scope of the invention is not limited to the illustrated example.

An exemplary embodiment of the invention applied to a small-sized electronic calculator will be described below with reference to FIGS. 1 to 8.

Figure 1:
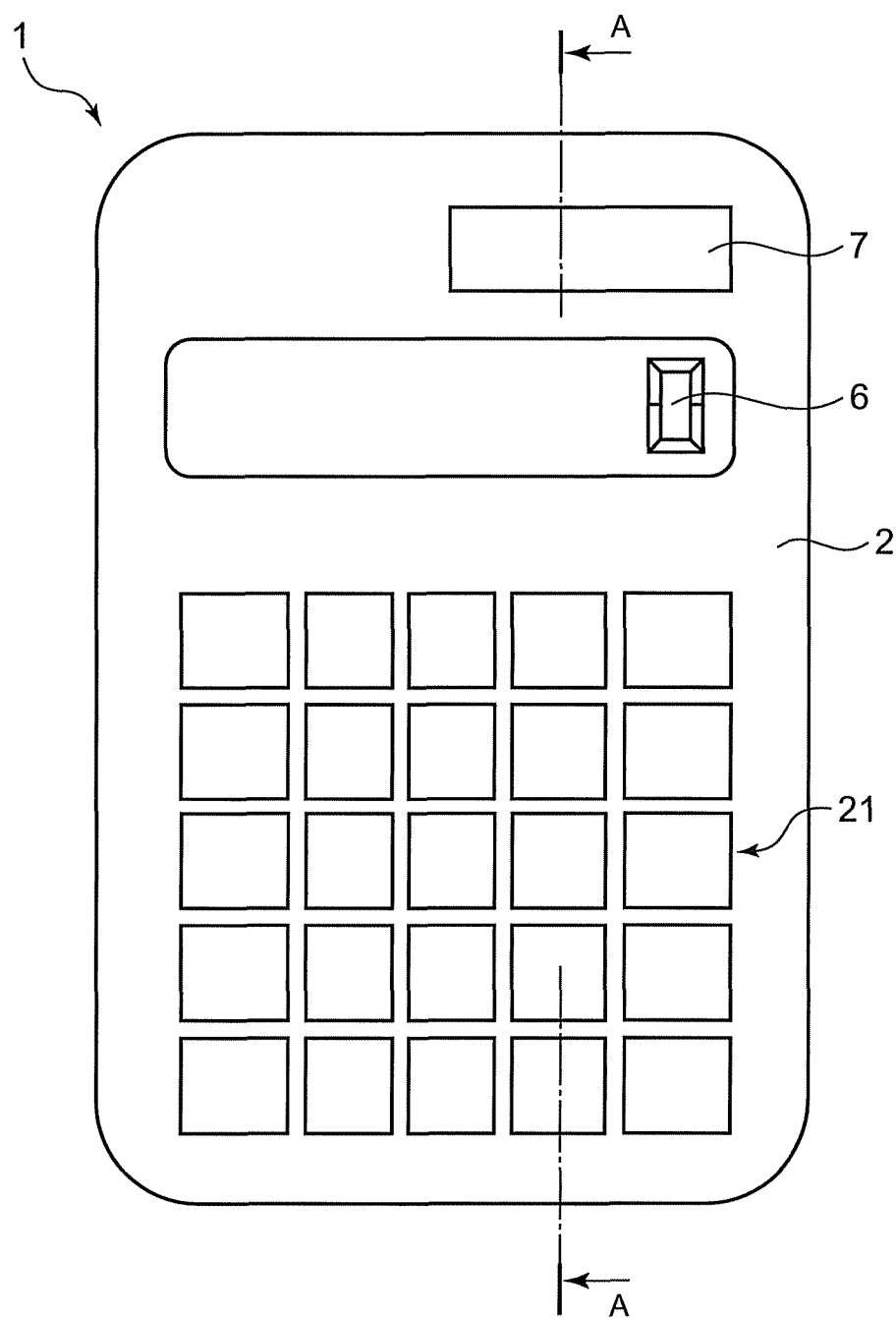
FIG. 1 is a front view showing a small-sized electronic calculator according to an exemplary embodiment of the invention.
Figure 2:
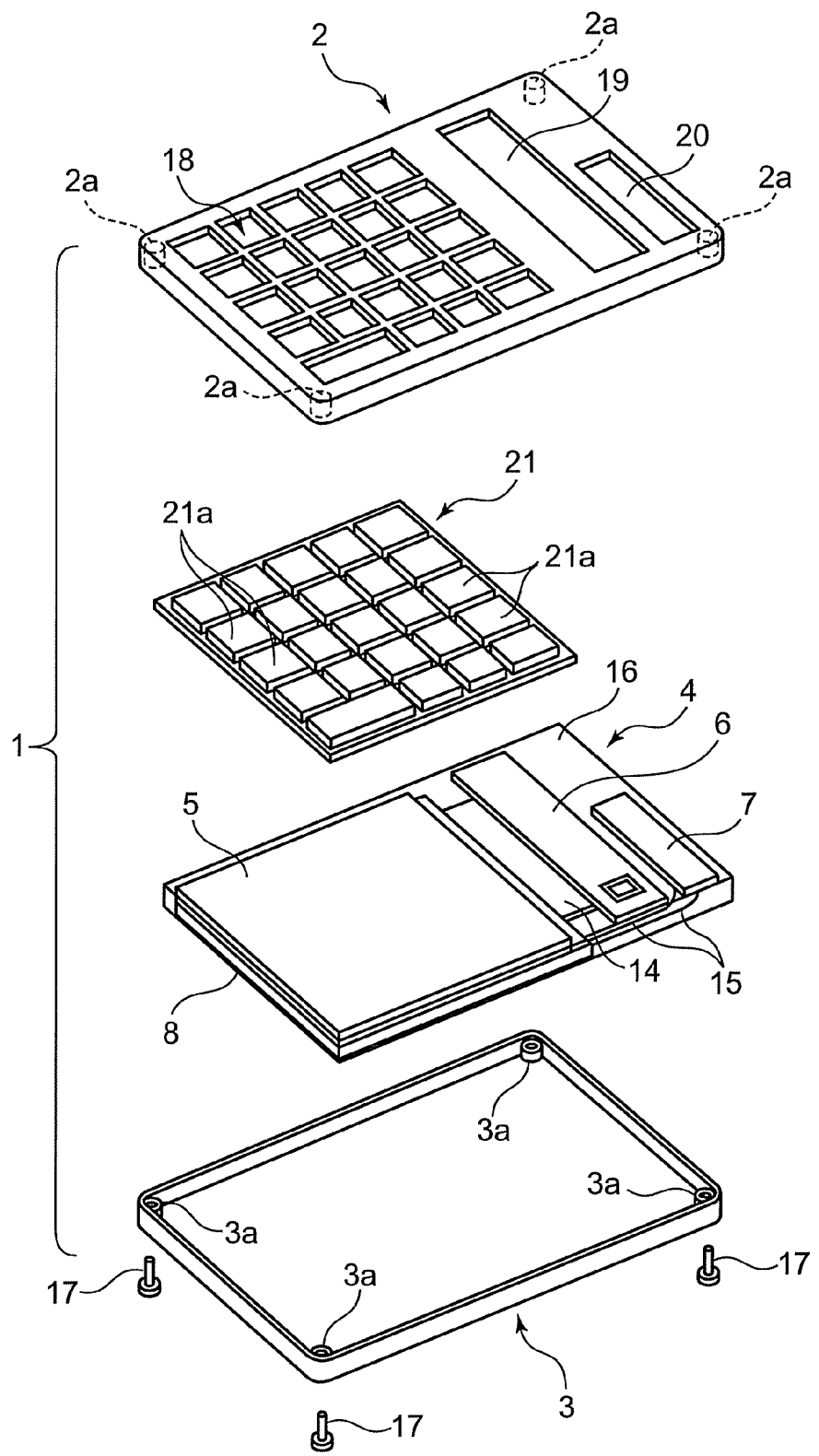
FIG. 2 is an exploded perspective view showing the small-sized electronic calculator depicted in FIG. 1.
Figure 3:
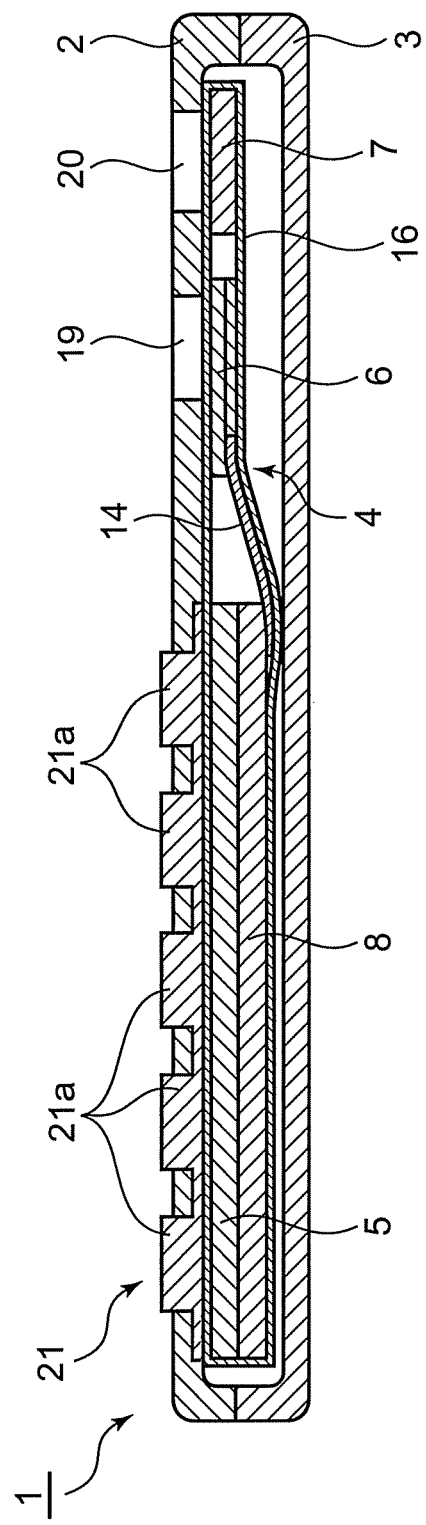
FIG. 3 is an enlarged sectional view taken in the line A-A, of the small-sized electronic calculator depicted in FIG. 1.

As shown in FIGS. 1 to 3, the small-sized electronic calculator has a device casing 1. As shown in FIGS. 2 and 3, the device casing 1 has an upper casing 2 and a lower casing 3 and is formed so that a device module 4 is incorporated in between the upper and lower casings 2 and 3.

Figure 4:
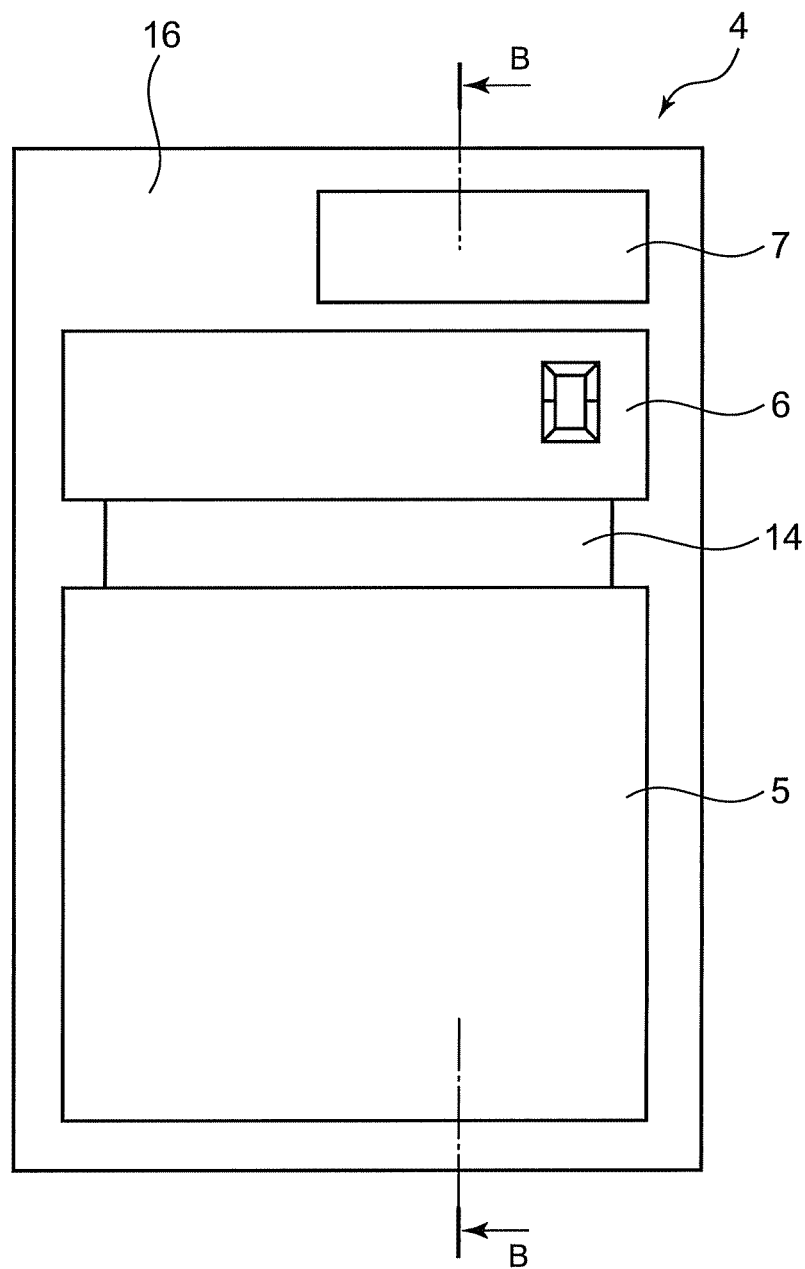
FIG. 4 is a front view showing a top of a device module depicted in FIG. 2.
Figure 5:
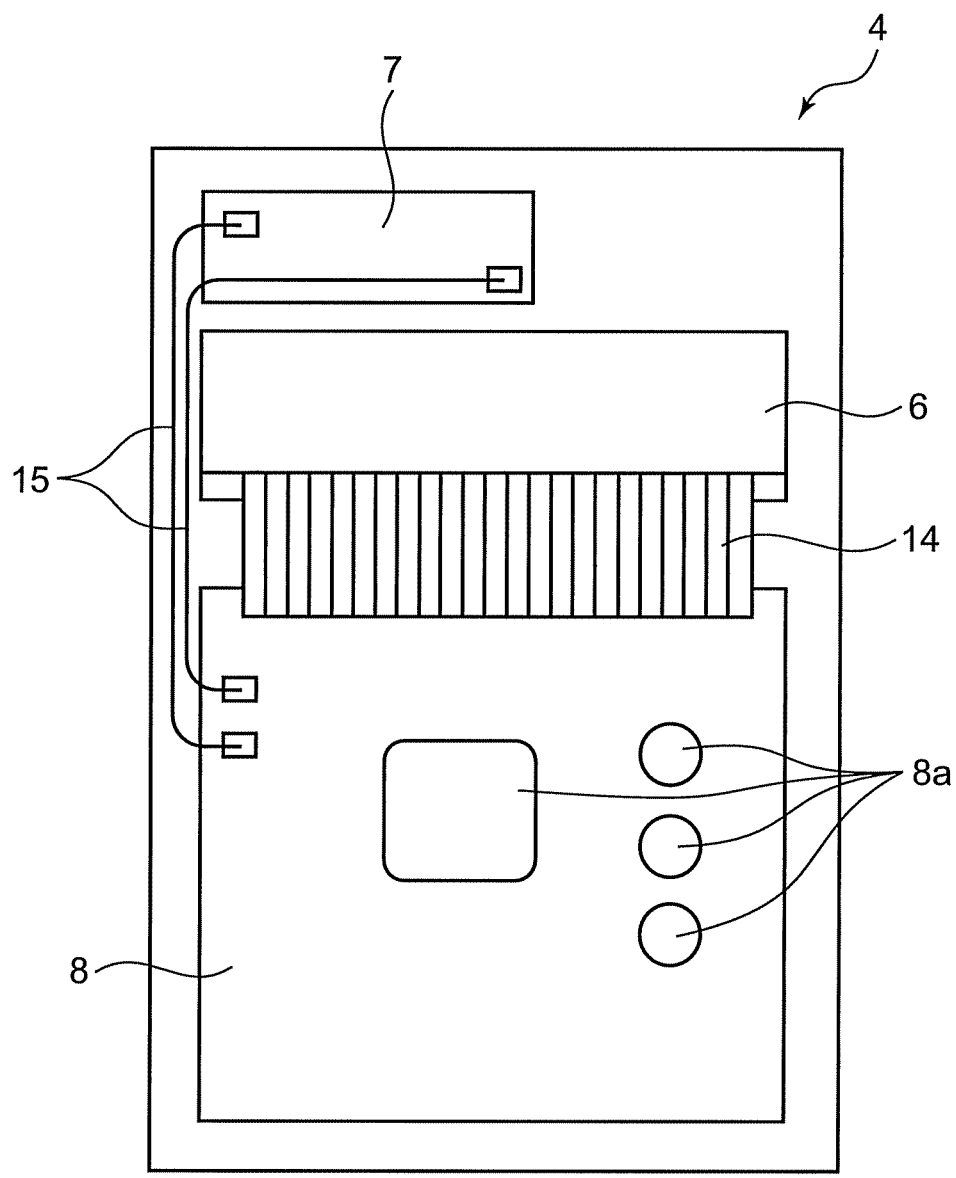
FIG. 5 is a rear view showing a bottom of the device module depicted in FIG. 2.

As shown in FIGS. 2 to 6, the device module 4 has a key input portion 5, a display portion 6, a solar panel 7 as a power supply portion, and a circuit board 8. The device module 4 is formed so that the key input portion 5, the display portion 6 and the solar panel 7 are electrically connected to the circuit board 8. In this case, the circuit board 8 electrically controls circuits generally. As shown in FIG. 5, various electronic components 8a necessary for calculating function, such as LSI's (Large-Scale Integrated Circuits), are provided on a lower surface of the circuit board 8.

Figure 7:
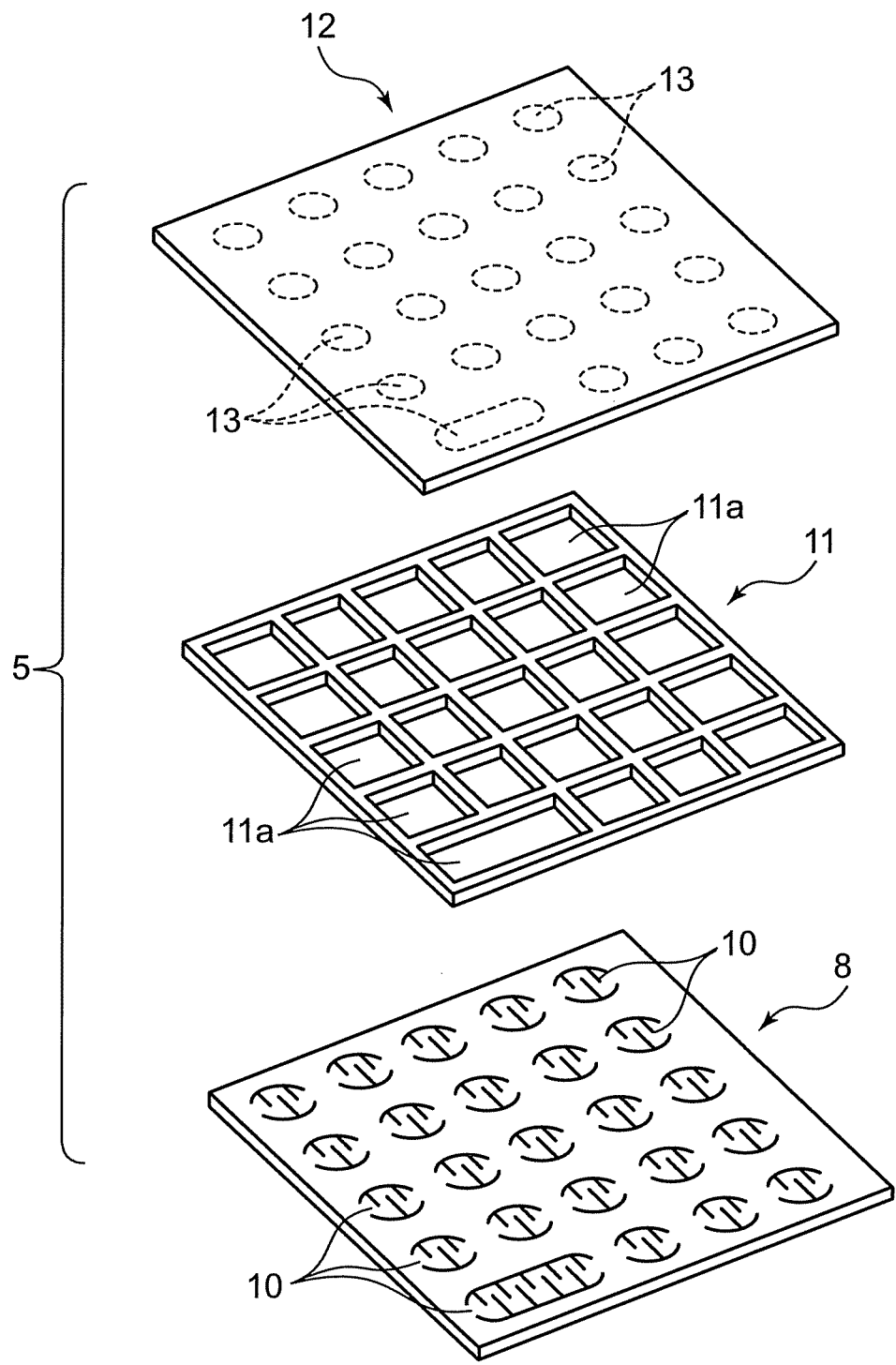
FIG. 7 is an exploded enlarged perspective view showing a key input portion of the device module depicted in FIG. 4.
Figure 8:
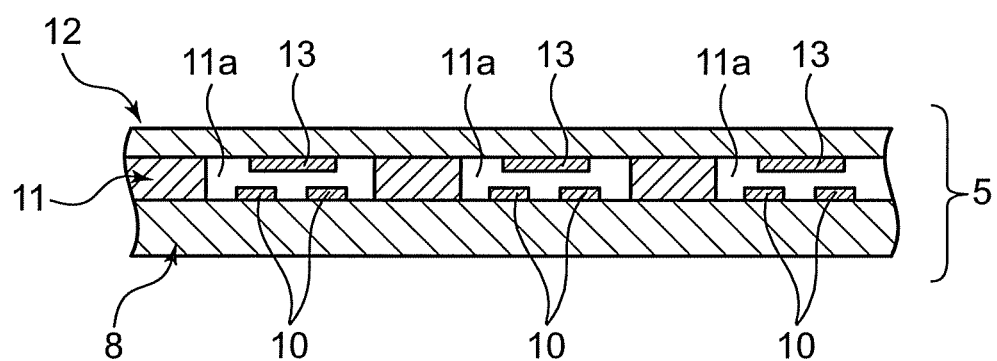
FIG. 8 is an enlarged sectional view of important part showing a region A of the key input portion depicted in FIG. 6.

As shown in FIGS. 7 and 8, the key input portion 5 is provided in an upper surface of the circuit board 8. The key input portion 5 has fixed contacts 10, a lattice spacer sheet 11, a movable sheet 12, and movable contacts 13. The fixed contacts 10 are arranged crisscross in the upper surface of the circuit board 8. The spacer sheet 11 is provided on the circuit board 8. The movable sheet 12 has flexibility and is provided on the spacer sheet 11. The movable contacts 13 are arranged crisscross in a lower surface of the movable sheet 12.

In this case, each of the fixed contacts 10 is composed of a pair of electrodes. The lattice spacer sheet 11 has openings 11a provided in places corresponding to the fixed contacts 10 respectively. The movable contacts 13 are provided opposite to the fixed contacts 10 in places corresponding to the openings 11a of the lattice spacer sheet 11 so that the movable contacts 13 can be attached/detached to/from the fixed contacts 10 respectively. In the key input portion 5, when one of the movable contacts 13 comes into contact with a corresponding one of the fixed contacts 10 so that the movable contact 13 is put between the pair of electrodes in the fixed contact 10, the pair of electrodes are electrically connected to each other to output a key signal.

The display portion 6 is configured with a flat display panel such as a crystal liquid display panel or an EL (Electro Luminescence) display panel. The display portion 6 is formed to electro-optically display various kinds of information such as information inputted through the key input portion 5 and a calculation result of the information. As shown in FIGS. 2 to 6, the display portion 6 is disposed flatly in the vicinity of an upper side of the circuit board 8 and electrically connected to the circuit board 8 by a flexible wiring board 14.

The solar panel 7 serving as a power supply portion receives external light such as sunlight and generates electric power. As shown in FIGS. 2 to 6, the solar panel 7 is disposed flatly in the vicinity of an upper side of the display portion 6. The solar panel 7 is electrically connected to the circuit board 8 by connection wires 15 such as lead wires so that electric power generated by the solar panel 7 is supplied to all the circuits of the circuit board 8.

Such a device module 4 is formed as follows. That is, the circuit board 8 equipped with the key input portion 5, the display portion 6 and the solar panel 7 are disposed totally substantially flatly and, in this state, they are enveloped entirely in a sheet member 16 and sealed with the sheet member 16. The sheet member 16 is a transparent or translucent sheet made of one of soft and hard synthetic resins such as polyvinyl chloride, polyethylene terephthalate (PET), polycarbonate, silicone rubber, elastomer, etc. Preferably, the sheet member 16 is a transparent sheet made of a soft synthetic resin.

As shown in FIGS. 2 to 6, the sheet member 16 is disposed so as to be continued to all upper and lower surfaces of the circuit board 8 equipped with the key input portion 5, the display portion 6 and the solar panel 7. In this state, the sheet member 16 is formed so as to be shielded by thereto compression bonding or ultrasonic welding in the condition that the sheet member 16 is continued over all the circumference of the device module 4. In this manner, the device module 4 is formed so that the circuit board 8 equipped with the key input portion 5, the display portion 6 and the solar panel 7 are enveloped entirely in the sheet member 16 and sealed with the sheet member 16.

As shown in FIGS. 1 to 3, the device casing 1 containing the device module 4 in its inside is formed so that the upper casing 2 and the lower casing 3 are detachably attached to each other by screws 17 in the condition that the upper casing 2 and the lower casing 3 are put on top of each other. In this case, as shown in FIG. 2, the lower casing 3 is shaped like a rectangular box so that the device module 4 can be disposed in the rectangular box. Screw inserting holes 3a are provided in four corners of the lower casing 3 respectively so that the screws 17 can be inserted in the screw insertion holes 3a from below.

As shown in FIGS. 1 to 3, the upper casing 2 is formed to have the same shape and size as those of the lower casing 3. As shown in FIG. 2, screw holes 2a are provided in four corners of the upper casing 2 respectively so that the screws 17 can be thread-engaged with the screw holes 2a from below. Thus, as shown in FIGS. 2 and 3, the device module 4 is disposed in the lower casing 3, the upper casing 2 and the lower casing 3 are then put on top of each other, and in this state, the screws 17 are inserted in the screw insertion holes 3a from below the lower casing 3 and thread-engaged and tightened with the screw holes 2a of the upper casing 2 so that the upper and lower casings 2 and 3 are attached to each other to thereby form the device casing 1.

In this case, as shown in FIG. 3, the upper and lower casings 2 and 3 are formed to be simply joined to each other by tightening the screws 17 without provision of any water proofing structure using waterproof packing etc. in a joint portion between the upper and lower casings 2 and 3. As shown FIGS. 1 to 3, first to third openings 18 to 20 are provided in the upper casing 2 so as to correspond to the key input portion 5, the display portion 6 and the solar panel 7 in the device module 4 respectively.

As shown in FIGS. 2 and 3, the first opening 18 of the first to third openings 18 to 20 is shaped like a lattice and provided in a place of the upper casing 2 corresponding to the key input portion 5. The first opening 18 is provided in a state that a key sheet 21 is disposed on the upper surface of the device module 4 corresponding to the key input portion 5, i.e. on the sheet member 16 of the device module 4.

The key sheet 21 is made of a soft synthetic resin such as rubber. As shown in FIGS. 2 and 3, key tops 21a are formed in an upper surface of the key sheet 21 so as to protrude upwards. The key tops 21a correspond to various kinds of keys necessary for calculation function, such as numeric keys, calculation keys and functional keys. The key tops 21a are provided so as to correspond to the fixed contacts 10 of the key input portion 5 and the movable contacts 13 corresponding to the fixed contacts 10, respectively. The key tops 21a are inserted in the first opening 18 shaped like a lattice from below, so that the key tops 21a are exposed in the upper surface of the upper casing 2.

In this manner, as shown in FIGS. 3 to 8, the key sheet 21 is formed as follows. When one of the key tops 21a is pushed down from above the upper casing 2, the key sheet 21 is bent to push down a corresponding one of the movable contacts 13 in the movable sheet 12 of the key input portion 5 disposed under the key sheet 21. Consequently, the pushed-down movable contact 13 comes into contact with a corresponding one of the fixed contacts 10 of the circuit board 8 to electrically connect the pair of electrodes of the fixed contact 10 to each other to thereby obtain a key signal in the key input portion 5.

Moreover, as shown in FIGS. 1 and 3, the second opening 19 is shaped like a long sideway rectangle and provided in a place of the upper casing 2 corresponding to the display portion 6 of the device module 4 so that information displayed on the display portion 6 can be viewed from above the upper casing 2. Moreover, as shown in FIGS. 1 and 3, the third opening 20 is shaped like a long sideway rectangle and provided in a place of the upper casing 2 corresponding to the solar panel 7 serving as a power supply portion of the device module 4, so that the solar panel 7 generates electric power based on external light such as sunlight irradiated on the solar panel 7 from above the upper casing 2.

The case where such a small-sized electronic calculator is assembled will be described next.

In this case, as shown in FIGS. 4 to 8, the device module 4 is first assembled. At this time, the key input portion 5 is disposed on the circuit board 8. That is, the movable sheet 12 is disposed through the spacer sheet 11 of the key input portion 5 on the upper surface of the circuit board 8 so that the fixed contacts 10 provided in the circuit board 8 are located separately from and oppositely to the movable contacts 13 provided in the movable sheet 12, respectively, in the openings 11a of the spacer sheet 11.

Moreover, the display portion 6 is disposed flatly in the vicinity of the upper side of the circuit board 8. The display portion 6 is electrically connected to the circuit board 8 by the flexible wiring board 14. Moreover, the solar panel 7 serving as a power supply portion is disposed flatly in the vicinity of the upper side of the display portion 6. The solar panel 7 is electrically connected to the circuit board 8 by the connection wires 15 such as lead wires. In this state, the circuit board 8 equipped with the key input portion 5, the display portion 6 and the solar panel 7 are enveloped entirely in the sheet member 16 and sealed with the sheet member 16.

Figure 6:
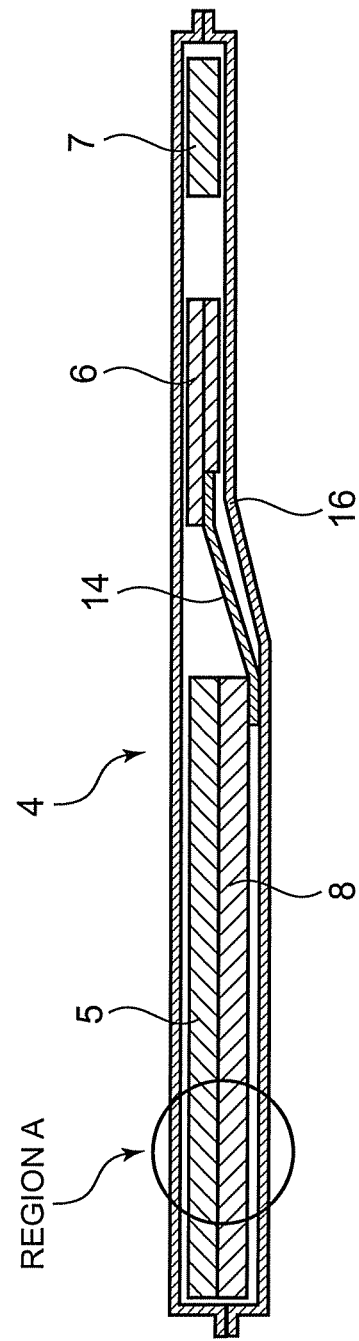
FIG. 6 is an enlarged sectional view taken along the line B-B, of the device module depicted in FIG. 4.

On this occasion, the sheet member 16 is disposed so as to be continued to all the upper and lower surfaces of the circuit board 8 equipped with the key input portion 5, the display portion 6 and the solar panel 7. In this state, the sheet member 16 is continuously shielded on the whole circumference by thereto compression bonding or ultrasonic welding. In this manner, as shown in FIGS. 4 to 6, the device module 4 is formed so that the circuit board 8 equipped with the key input portion 5, the display portion 6 and the solar panel 7 are enveloped entirely in the sheet member 16 and sealed with the sheet member 16. The device module 4 is kept waterproof and dustproof by the sheet member 16.

Then, the device module 4 is incorporated in the device casing 1. On this occasion, as shown in FIG. 2, the device module 4 enveloped in and sealed with the sheet member 16 is disposed in the lower casing 3. The key sheet 21 is disposed on the upper surface of a place of the device module 4 corresponding to the key input portion 5, that is, on the sheet member 16 of the device module 4. In this state, the upper casing 2 is put on the lower casing 3.

On this occasion, the key sheet 21 is disposed on the device module 4 while the key tops 21a of the key sheet 21 are disposed to correspond to the fixed contacts 10 of the key input portion 5 and to the movable contacts 13 corresponding to the fixed contacts 10, respectively. Moreover, the key tops 21a of the key sheet 21 are disposed to correspond to the first opening 18 shaped like a lattice. In addition, the display portion 6 of the device module 4 is disposed to correspond to the second opening 19 of the upper casing 2 while the solar panel 7 is disposed to correspond to the third opening 20 of the upper casing 2.

In this state, the screws 17 are inserted in the screw inserting holes 3a from below the lower casing 3 and thread-engaged and tightened with the screw holes 2a of the upper casing 2, respectively. In this manner, the upper casing 2 and the lower casing 3 are attached to each other to form the device casing 1, so that a small-sized electronic calculator containing the device module 4 in the device casing 1 is obtained. In the small-sized electronic calculator, as shown in FIGS. 1 and 3, the key tops 21a of the key sheet 21 are exposed in the upper surface of the upper casing 2 through the first opening 18.

In the small-sized electronic calculator, as shown in FIGS. 1 to 3, the display portion 6 of the device module 4 is disposed so as to correspond to the second opening 19 of the upper casing 2 so that information displayed on the display portion 6 can be viewed from above the upper casing 2. Moreover, the solar panel 7 serving as a power supply portion of the device module 4 is disposed so as to correspond to the third opening 20 of the upper casing 2 so that external light such as sunlight is irradiated on the solar panel 7 from above the upper casing 2.

Operation of such a small-sized electronic calculator will be described next.

In the small-sized electronic calculator, the key tops 21a of the key sheet 21 corresponding to the key input portion 5 are exposed upwards through the first opening 18 provided in the upper casing 2 of the device casing 1. The display portion 6 is exposed upwards through the second opening 19 provided in the upper casing 2 through the sheet member 16. The solar panel 7 is exposed upwards through the third opening 20 provided in the upper casing 2 through the sheet member 16.

In this state, external light such as sunlight is transmitted through the third opening 20 of the upper casing 2 and irradiated on the solar panel 7 because the sheet member 16 has optical transmissibility. The solar panel 7 generates electric power based on the irradiated external light and provides the electric power to electronic circuits of the circuit board 8. Accordingly, the small-sized electronic calculator is enabled to be used in this state. When each of the key tops 21a of the key sheet 21 is pushed down, information is input in response to the pushing operation so that the input information is displayed on the display portion 6.

That is, when one of the key tops 21a of the key sheet 21 is pushed down, the pushed-down key top 21a presses the movable sheet 12 of the key input portion 5 through the sheet member 16 as shown in FIG. 3. As shown in FIGS. 7 and 8, the movable sheet 12 is hence pushed down so that a corresponding movable contact 13 provided in the movable sheet 12 comes into contact with the fixed contact 10 of the circuit board 8 corresponding to the movable contact 13.

On this occasion, because the movable contact 13 comes into contact with the fixed contact 10 so as to be put between the pair of electrodes in the fixed contact 10, the pair of electrodes in the fixed contact 10 are electrically connected to each other. In this manner, the key input portion 5 gives a key signal corresponding to the pushed-down key top 21a to the electronic circuits of the circuit board 8. To this end, information is displayed on the display portion 6 based on the given key signal so that a calculation result of the information is displayed on the display portion 6.

Incidentally, when such a small-sized electronic calculator becomes dirty, the small-sized electronic calculator can be washed with water directly. That is, the small-sized electronic calculator can be cleaned easily in such a manner that the device casing 1 is washed with sponge while the device casing 1 is watered or immersed in water.

On this occasion, even when water penetrates into the device casing 1 through a gap between the upper and lower casings 2 and 3 of the device casing 1 or through the first to third openings 18 to 20 provided in the upper casing 2, the water penetrating into the device casing 1 has no bad influence on the device module 4 because the circuit board 8 equipped with the key input portion 5, the display portion 6, and the solar panel 7 in the device module 4 are entirely enveloped in and sealed with the sheet member 16. Consequently, the aforementioned operation can be performed without any change.

When gaps between the key tops 21a of the key sheet 21 are choked with dust or the like, the device casing 1 can be decomposed and washed. On this occasion, when the screws 17 are removed from below the lower casing 3, the upper and lower casings 2 and 3 can be detached easily from each other. In this manner, the key sheet 21 and the device module 4 incorporated in the device casing 1 can be taken out, so that the upper casing 2, the lower casing 3, the key sheet 21 and the device module 4 can be cleanly washed individually.

When the small-sized electronic calculator is used in a desert or the like, the small-sized electronic calculator can be used well without any bad influence of sand. For example, even when sand penetrates into the device casing 1 because of a sandstorm in a desert, the small-sized electronic calculator can be used as it is, similarly to the case where the small-sized electronic calculator is washed with water, because the circuit board 8 equipped with the key input portion 5, the display portion 6 and the solar panel 7 in the device module 4 are entirely enveloped in and sealed with the sheet member 16 so that dust such as sand penetrating into the device casing 1 has no bad influence on the device module 4.

As described above, because the device module 4 of the small-sized electronic calculator is formed so that the key input portion 5, the display portion 6, the solar panel 7 and the circuit board 8 are entirely enveloped in and sealed with the sheet member 16 in the condition that the key input portion 5, the display portion 6 and the solar panel 7 serving as a power supply portion are electrically connected to the circuit board 8, the device module 4 can be kept waterproof and dustproof in a simple structure in which the key input portion 5, the display portion 6, the solar panel 7 and the circuit board 8 are entirely enveloped in and sealed with the sheet member 16 in the condition that the key input portion 5, the display portion 6 and the solar panel 7 are electrically connected to the circuit board 8.

For this reason, the device module 4 can be washed with water directly as it is. Moreover, the structure of the device casing 1 can be simplified and reduction in cost of the device casing 1 can be attained because it is unnecessary to provide any water proofing structure using waterproof packing or the like in the device casing 1. In addition, the device casing 1 can be washed with water directly in the condition that the device module 4 is incorporated in the device casing 1. Consequently, it is possible to provide a small-sized electronic calculator with good user-friendliness.

In this case, because the sheet member 16 is a sheet made of a transparent or translucent synthetic resin, information displayed on the display portion 6 can be viewed well through the sheet member 16 even when the display portion 6 is covered with the sheet member 16.

Moreover, because the solar panel 7 serving as a power supply portion receives external light such as sunlight and generates electric power, it is possible to receive external light such as sunlight through the sheet member 16 surely and generate electric power well even when the solar panel 7 is covered with the sheet member 16. For this reason, even when the device module 4 is enveloped in and sealed with the sheet member 16, it is still possible to provide a small-sized electronic calculator with good user-friendliness because it is unnecessary to replace a battery.

Moreover, in accordance with the small-sized electronic calculator, the small-sized electronic calculator includes the device module 4 and the device casing 1 in which the device module 4 is incorporated. The device module 4 is formed so that the key input portion 5, the display portion 6, the solar panel 7 and the circuit board 8 are entirely enveloped in and sealed with the sheet member 16 in the condition that the key input portion 5, the display portion 6 and the solar panel 7 are electrically connected to the circuit board 8. Accordingly, the device module 4 can be kept waterproof and dustproof in the condition that the key input portion 5, the display portion 6 and the solar panel 7 are electrically connected to the circuit board 8.

For this reason, the structure of the device casing 1 can be simplified and reduction in total cost of the device can be attained because it is unnecessary to use any water proofing structure using packing or the like in the device casing 1. Moreover, because the device module 4 sealed with the sheet member 16 is incorporated in the device casing 1, the sheet member 16 is substantially prevented from being exposed outside the device casing 1 so that the sheet member 16 can be protected by the device casing 1.

In this manner, the sheet member 16 can be hardly broken in use of the small-sized electronic calculator so that durability of the sheet member 16 can be enhanced and water proofing property and dust proofing property of the device module 4 can be enhanced by the sheet member 16. Moreover, the touch feeling of the device casing 1 in use of the small-sized electronic calculator is prevented from being spoiled by the sheet member 16, so that the small-sized electronic calculator can be used well.

In this case, the device casing 1 can be washed with water directly even when the device casing 1 becomes dirty. That is, the device casing 1 can be cleaned easily such that the device casing 1 is washed with sponge, while the device casing 1 is watered or immersed in water. On this occasion, even when water penetrates into the device casing 1, the small-sized electronic calculator can be used well as it is, because the circuit board 8 equipped with the key input portion 5, the display portion 6 and the solar panel 7 in the device module 4 are entirely enveloped in and sealed with the sheet member 16 so that the water penetrating into the device casing 1 has no bad influence on the device module 4.

Even when the small-sized electronic calculator is used in a desert or the like, the small-sized electronic calculator can be used well without any bad influence of sand. For example, even when sand penetrates into the device casing 1 because of a sandstorm in a desert, the small-sized electronic calculator can be used well as it is, because the circuit board 8 equipped with the key input portion 5, the display portion 6 and the solar panel 7 in the device module 4 are entirely enveloped in and sealed with the sheet member 16 so that dust such as sand penetrating into the device casing 1 has no bad influence on the device module 4.

In addition, the device casing 1 has the upper casing 2 and the lower casing 3. Since the upper and lower casings 2 and 3 are detachably attached to each other, the upper and lower casings 2 and 3 can be separated from each other when the device casing 1 needs to be washed with water. In this manner, the device module 4 incorporated in the device casing 1 can be taken out so that the upper casing 2, the lower casing 3 and the device module 4 can be cleanly washed individually.

In the small-sized electronic calculator, the first and second openings 18 and 19 corresponding to the key input portion 5 and the display portion 6 of the device module 4 are provided in the upper casing 2 so that the key input portion 5 and the display portion 6 can be exposed outside the upper casing 2 through the first and second openings 18 and 19 even when the device module 4 enveloped in and sealed with the sheet member 16 is incorporated in the device casing 1. For this reason, any key in the key input portion 5 can be operated from the outside of the device casing 1 and information displayed on the display portion 6 can be viewed from the outside of the device casing 1.

In this case, the key sheet 21 having the key tops 21a is provided in the first opening 18 in a place of the upper casing 2 corresponding to the key input portion 5 of the device module 4 so that any one of the key tops 21a of the key sheet 21 can be pressed through the first opening 18 of the upper casing 2 from the outside of the upper casing 2. In this manner, any key in the key input portion 5 of the device module 4 can be operated surely and well.

Also in this case, because the sheet member 16 of the device module 4 is a sheet made of a transparent or translucent synthetic resin, information displayed on the display portion 6 can be viewed well through the sheet member 16 from the outside of the device casing 1 even when the device module 4 is incorporated in the device casing 1.

Moreover, because the solar panel 7 serving as a power supply portion receives external light such as sunlight and generates electric power, the solar panel 7 can receive external light such as sunlight through the sheet member 16 surely, generate electric power well and supply the generated electric power to the electronic circuits of the circuit board 8 even when the solar panel 7 is incorporated together with the device module 4 in the device casing 1. Consequently, because it is unnecessary to replace a battery, it is possible to provide a small-sized electronic calculator with good user-friendliness.

Figure 9:
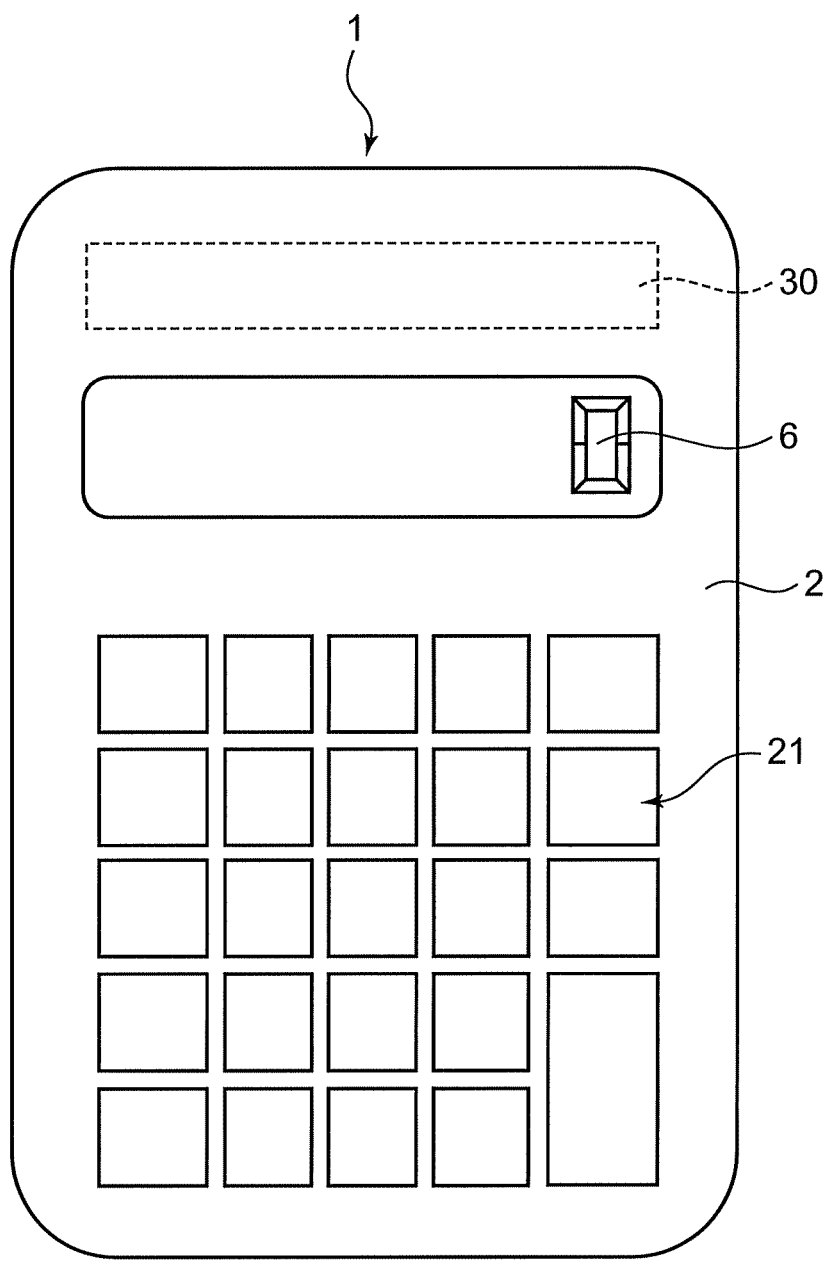
FIG. 9 is a front view showing a first modification in the small-sized electronic calculator according to the exemplary embodiment depicted in FIGS. 1 to 8.
Figure 10:
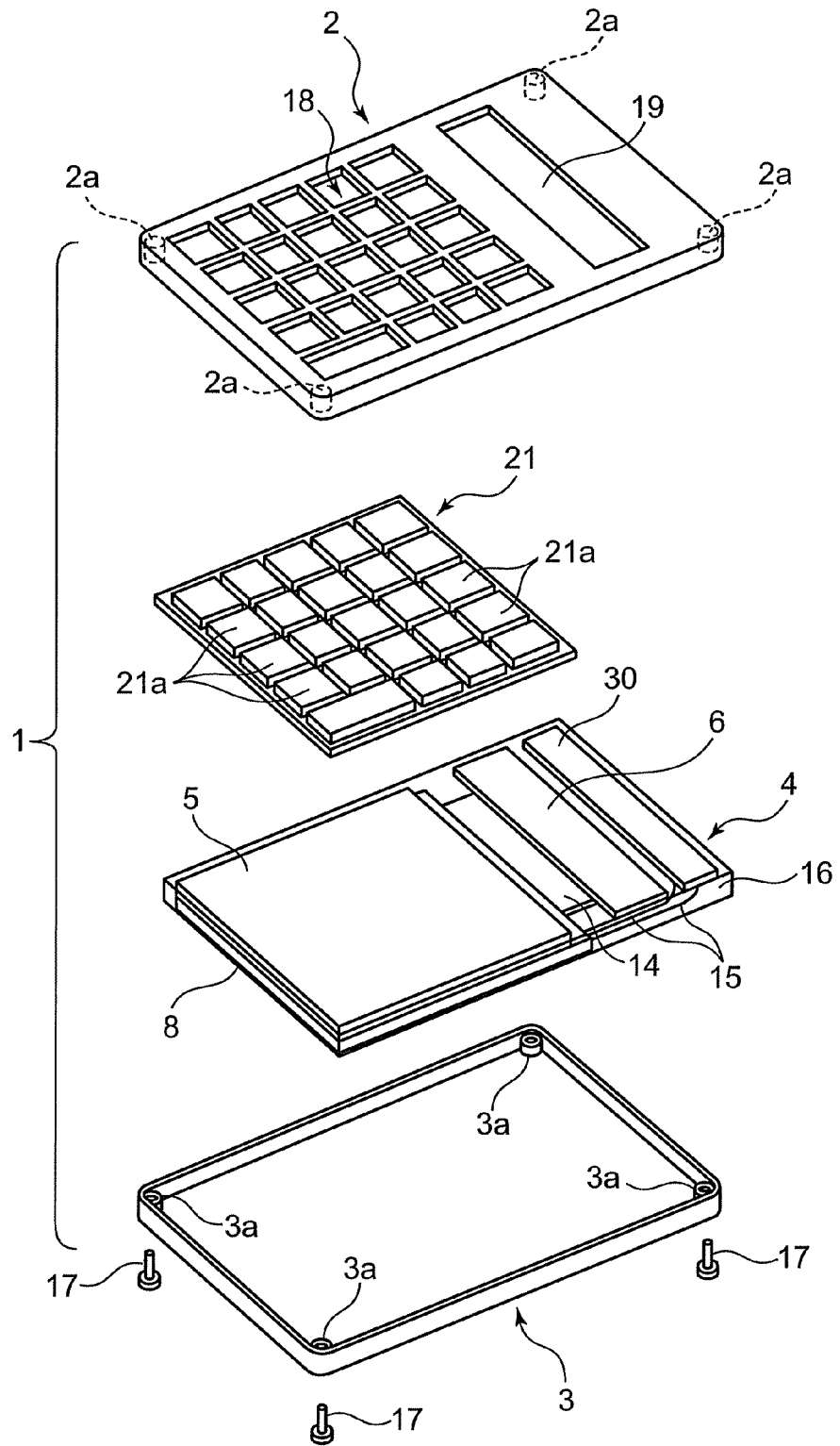
FIG. 10 is an exploded perspective view showing the small-sized electronic calculator according to the first modification depicted in FIG. 9.

Although the aforementioned exemplary embodiment has been described in the case where the solar panel 7 is used as a power supply portion, exemplary embodiments of the invention are not limited thereto. For example, as represented by a first modification shown in FIGS. 9 and 10, an electromagnetic induction type rechargeable battery 30 supplied with electric power by electromagnetic induction may be used as the power supply portion. Also in the case, the electromagnetic induction type rechargeable battery 30 is disposed flatly in the vicinity of the display panel 6 and electrically connected to the circuit board 8 through the connection wires 15 such as lead wires, similarly to the solar panel 7. With the configuration, the electromagnetic induction type rechargeable battery 30 supplies electric power to all the circuits of the circuit board 8.

In the small-sized electronic calculator including such an electromagnetic induction type rechargeable battery 30, it is unnecessary to provide any third opening 20 like that of the aforementioned exemplary embodiment in the upper casing 2 located in a place corresponding to the rechargeable battery 30. Accordingly, the structure of the upper casing 2 can be further simplified and the rechargeable battery 30 can be concealed by the upper and lower casings 2 and 3. Consequently, it is possible to obtain a small-sized electronic calculator having preferred external appearance in design.

Even if the rechargeable battery 30 is concealed by the device casing 1 in this manner, the rechargeable battery 30 can be charged from the outside of the device casing 1 by an electromagnetic induction type charger (not shown). Accordingly, in the small-sized electronic calculator, because it is unnecessary to replace the battery similarly to the aforementioned exemplary embodiment, it is possible to provide the small-sized electronic calculator with good user-friendliness even if the device module 4 equipped with the rechargeable battery 30 is enveloped in and sealed with the sheet member 16.

Figure 11:
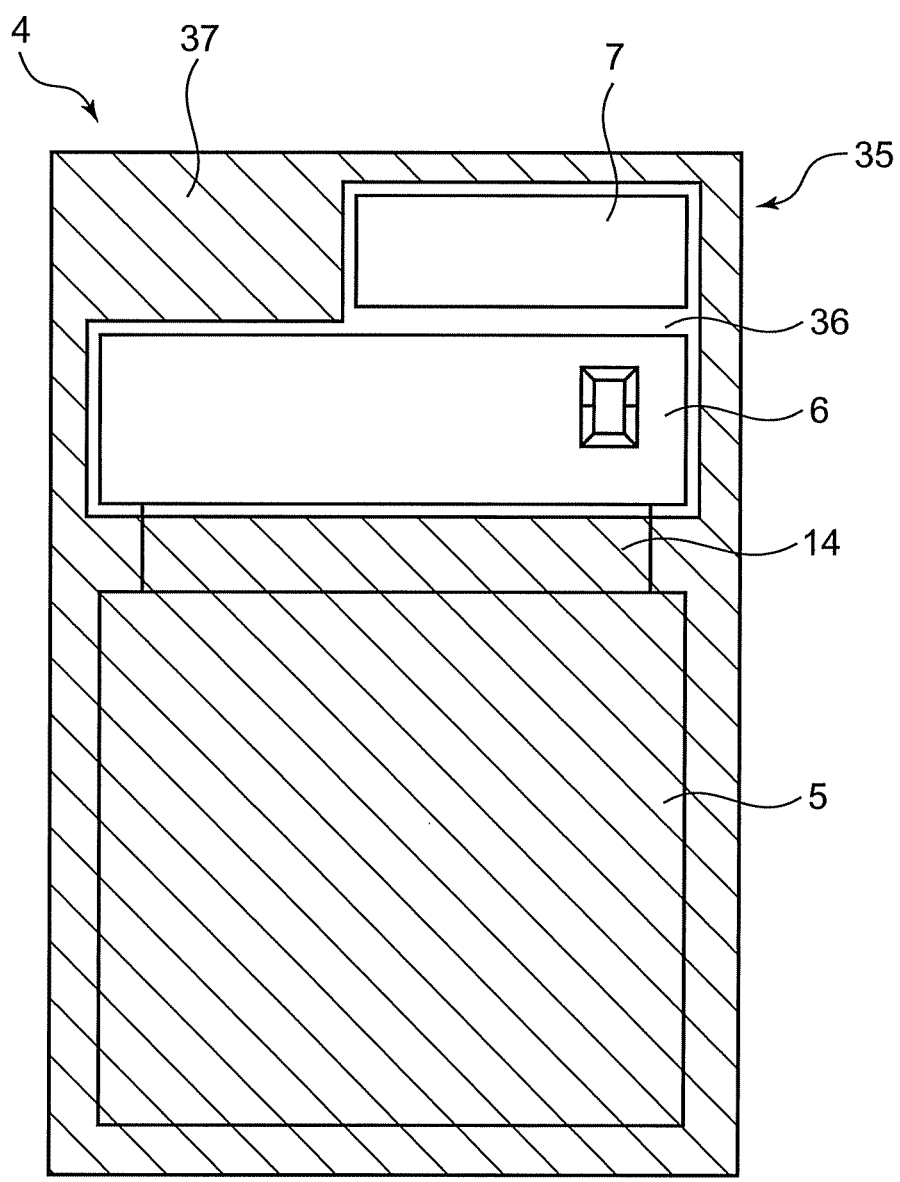
FIG. 11 is a front top view showing a device module according to a second modification of the exemplary embodiment depicted in FIGS. 1 to 8.
Figure 12:
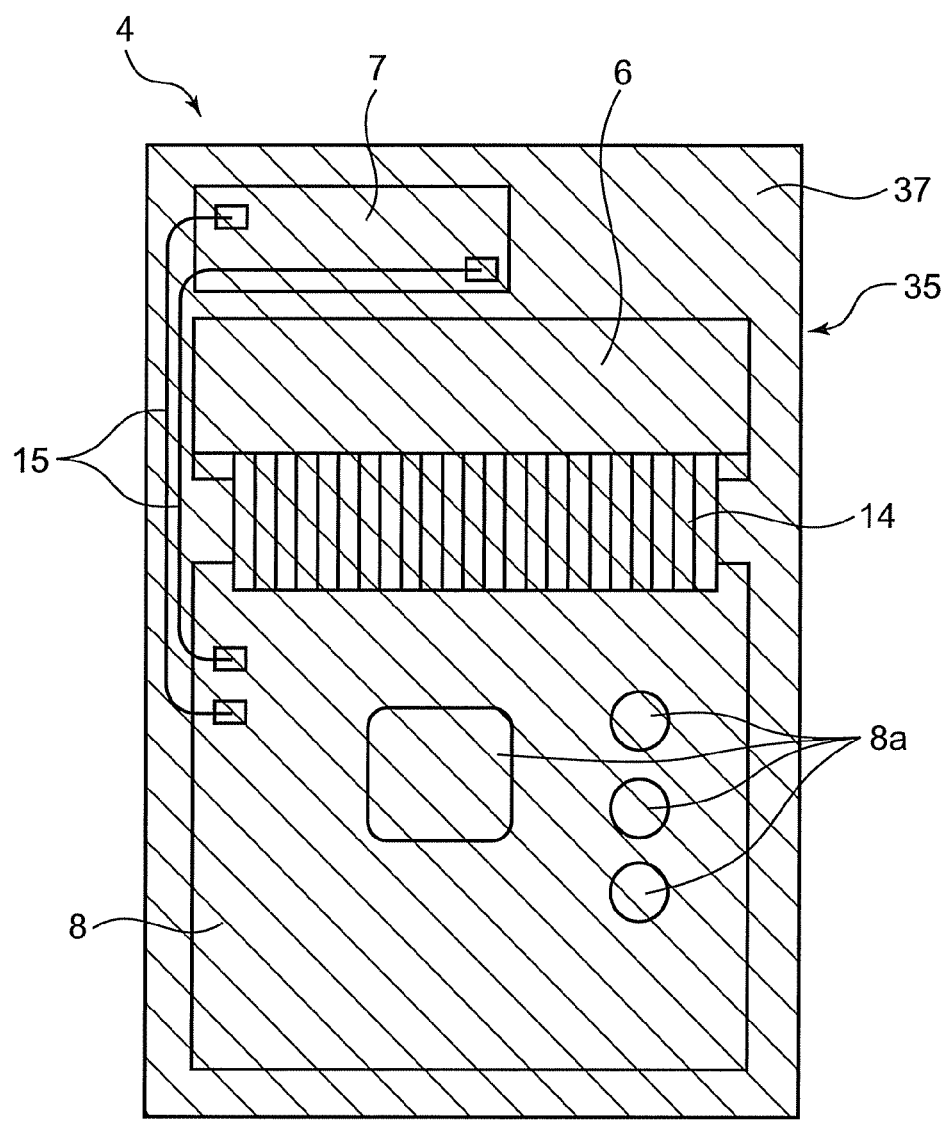
FIG. 12 is a rear view showing a bottom of the device module according to the second modification depicted in FIG. 11.

Although the aforementioned exemplary embodiment has been described in the case where the sheet member 16 is made of a transparent or translucent synthetic resin, the invention is not limited thereto. For example, as represented by a second modification shown in FIGS. 11 and 12, a light transmissible portion 36 is provided in a sheet member 35 so as to correspond to the display portion 6 and the solar panel 7 and a light shielding portion 37 which does not transmit light is provided in the sheet member 35 except the light transmissible portion 36.

That is, the light shielding portion 37 is a colored portion which is formed in such a manner that the sheet member 35 is colored with a coating composition such as light non-transmissible ink. The colored portion which is the light shielding portion 37 is formed in such a manner that a coating composition such as ink is applied on the whole surface of the sheet member 35 except the light transmissible portion 36 corresponding to the front surface of the display portion 6 and the front surface of the solar panel 7, in the whole surface of the sheet member 35 located on the back surface of the device module 4 and the whole surface of the sheet member 35 located on the front surface of the device module 4.

When configuration is made in this manner, information displayed on the display portion 6 can be viewed from the outside through the light transmissible portion 36 of the sheet member 35 similarly to the aforementioned exemplary embodiment. In addition, the solar panel 7 can receive external light and generate electric power and various kinds of electronic components 8a mounted on the circuit board 8 and the key input portion 5 can be concealed by the light shielding portion 37 so that they can be prevented from being viewed from the outside.

Although the aforementioned exemplary embodiment and the modifications thereof have been described in the case where the device casing 1 has the upper casing 2 and the lower casing 3 which are detachably attached to each other by the screws 17, it is not always necessary to detachably attach the upper casing 2 and the lower casing 3 to each other by the screws 17. For example, configuration may be made so that a hook portion is provided in one of the upper and lower casings 2 and 3 while a lock portion capable of being removably engaged with the hook portion is provided in the other of the upper and lower casings 2 and 3 so that the upper and lower casings 2 and 3 can be separated from each other through one-touch operation.

Moreover, though the aforementioned exemplary embodiment and the modifications thereof have been described in the case where the invention is applied to a small-sized electronic calculator, the invention is not necessarily limited to the small-sized electronic calculator. For example, the invention may be widely applied to various kinds of electronic devices such as a cellular phone, an electronic dictionary, a portable personal computer, a watch, etc.

What is claimed is:

1. An electronic device comprising:
   a device module comprising:
   a key input portion comprising a plurality of key contacts;
   a display portion;
   a power supply portion;
   a circuit board that is electrically connected to the key input portion, the display portion and the power supply portion;
   a sheet member, wherein the key input portion, the display portion, the power supply portion, and the circuit board are entirely enveloped by and hermetically sealed with the sheet member;

a key sheet mounted on the key input portion and comprising a plurality of key tops thereon, wherein each of the key tops is provided to face a corresponding one of the key contacts a device casing housing the device module and the key sheet therein and comprising:

an upper casing having a plurality of openings therethrough, wherein each of the key tops is exposed from a corresponding one of the openings; and a lower casing that is detachably attached to the upper casing.

2. The electronic device of claim 1, wherein
the sheet member comprises a transparent or translucent light-transmissible member which is provided to face the display portion.

3. The electronic device of claim 2, wherein the plurality of key tops comprises numeric keys and calculation keys, and the circuit board comprises an electronic component having calculation function thereon.

4. The electronic device of claim 3, wherein the power supply portion is a solar panel configured to receive external light and generate electric power.

5. The electronic device of claim 2, wherein the key input portion further comprises:

a grid-shaped spacer sheet mounted on the circuit board; and a flexible movable sheet mounted on the spacer sheet, wherein the plurality of key contacts comprises:

a plurality of fixed contacts arranged in a matrix fashion on the movable sheet to face the plurality of fixed contacts.

6. The electronic device of claim 3, wherein the power supply portion is an electromagnetic induction type rechargeable battery which generates an electric power by electromagnetic induction.

7. The electronic device of claim 1, wherein the device module is waterproof.

* * * * *